United States Patent [19]

McElroy

[11] Patent Number: 4,687,951
[45] Date of Patent: Aug. 18, 1987

[54] FUSE LINK FOR VARYING CHIP OPERATING PARAMETERS

[75] Inventor: David J. McElroy, Houston, Tex.

[73] Assignee: Texas Instruments Incorporated, Dallas, Tex.

[21] Appl. No.: 666,013

[22] Filed: Oct. 29, 1984

[51] Int. Cl.[4] .......................... H03K 5/13; H03K 5/00; H03K 5/159; H01L 9/02

[52] U.S. Cl. ..................... 307/269; 307/262; 307/271; 307/200 B; 307/202.1; 307/453; 307/468; 307/481; 307/597; 307/605

[58] Field of Search ................ 307/200 B, 202.1, 443, 307/453, 468, 481, 591, 594, 595, 597, 601, 603, 605, 271, 269, 262, 530; 365/96

[56] References Cited

U.S. PATENT DOCUMENTS

| | | | |
|---|---|---|---|
| 3,619,670 | 11/1971 | Heimbigner | 307/453 |
| 4,081,701 | 3/1978 | White, Jr. et al. | 307/530 |
| 4,521,701 | 6/1985 | Reddy | 307/481 |

OTHER PUBLICATIONS

Fujitsu, "Fine Delay Adjustment".
Linton, "Technique for Optimizing Signals in Dynamic Memory Systems".
Linton, "Memory Noise Compensation Network".

Primary Examiner—Stanley D. Miller
Assistant Examiner—M. R. Wambach
Attorney, Agent, or Firm—John G. Graham

[57] ABSTRACT

Adjustment of operating parameters for a functional circuit is provided by fuse links (44) and (45). For a DRAM, the fuse links (44) control the various internal delays of a timing control generator (40) and fuse links (45) control the sensitivity of sense amplifiers by controlling an access control circuit (42). The sense amplifiers (14) determine the access parameters for a plurality of memory cell arrays (10) and (12). By varying the parameters of the sense amplifiers, the access parameters can be controlled by one adjustment on the central control circuitry.

19 Claims, 8 Drawing Figures

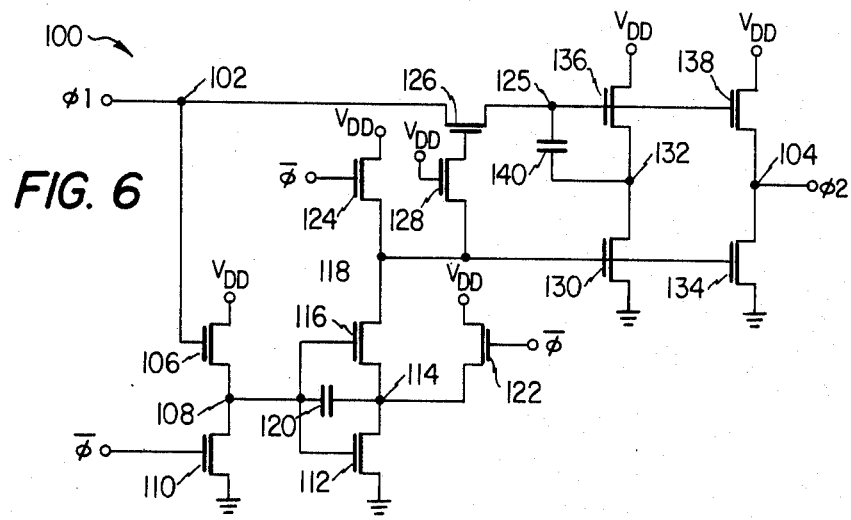
FIG. 5
FIG. 6
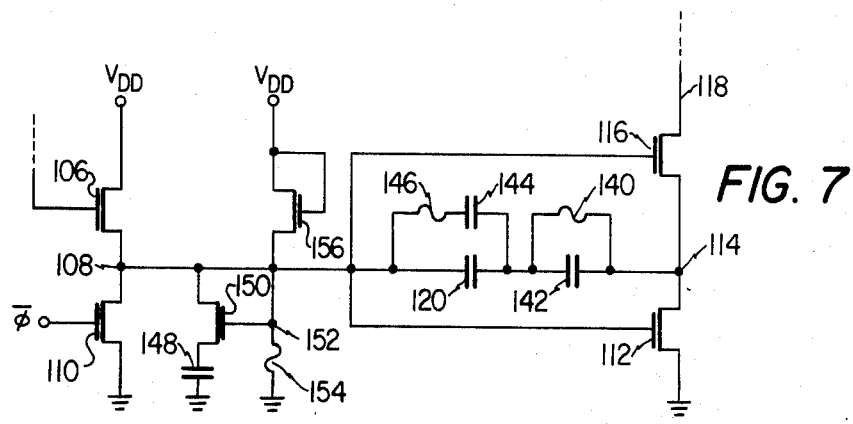
FIG. 7
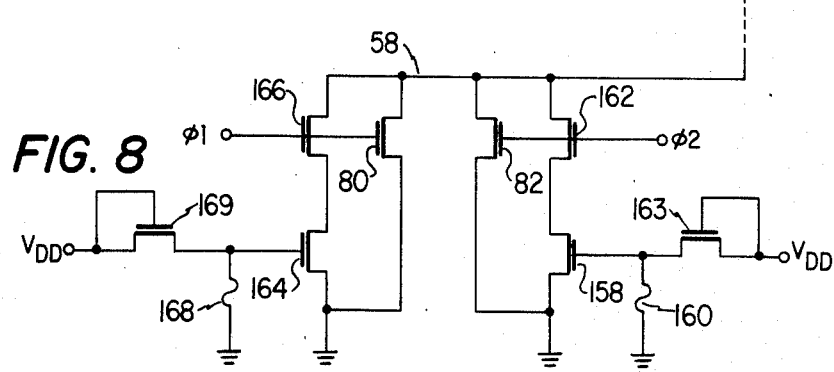
FIG. 8

FUSE LINK FOR VARYING CHIP OPERATING PARAMETERS

TECHNICAL FIELD OF THE INVENTION

The present invention pertains in general to high density semiconductor circuits and, more particularly, to methods for adjusting the parameters after fabrication to improve yields thereof.

BACKGROUND OF THE INVENTION

High density MOS devices have been increasing use in recent years in both consumer and military applications as a result of the demand for low cost information processing devices. In particular, MOS Random Access Memories (RAM's) constitute some of the densest components of conventional processing systems. As the density of these devices increases, various circuit and system techniques have been developed to maintain or increase performance with respect to that of less dense circuits without decreasing component yields. Yield, in particular, becomes the dominating factor when increasing the number of circuit elements per chip while maintaining or improving circuit operating parameters.

Response time in devices such as MOS RAMs is a function of the memory cell size, the number of cells per bit line and the type of sensing circuit utilized to access data stored in the cells. One example of this is illustrated in U.S. Pat. No. 4,081,701, issued to White et al. on Mar. 28, 1978 and assigned to Texas Instruments Incorporated. The sensing circuit or sense amp of U.S. Pat. No. 4,081,701 accesses data by increasing the sensitivity in discrete steps. In this manner, low signal levels stored in a memory cell can be sensed. All of the sense amps that access data in a selected row of memory elements are controlled by a centralized control circuit which controls current flow through each of the sense amps in discrete steps. Each of these discrete steps has a predetermined duration provided by timing signals from an internal clock circuit, each of the timing signals separated by delays generated internal to the clock circuit. Therefore, the sensitivity of the sense amps and the time required to access data therewith is controlled by this centralized control circuit. The operation of the sense amps is more fully disclosed in U.S. Pat. No. 4,050,061, issued to Kitagawa on Sept. 20, 1977. By varying the sensitivity of the sense amp for each discrete step and the time delay between the steps, access times can be increased or decreased, but not without some trade-offs such as signal margin, pattern sensitivity, etc.

Although the relationship between the various operating parameters of a given MOS circuit is defined in the design stage, variations may result due to processing variations. Attempts are made during the design phase of a circuit to accommodate for these process variations, but in some cases circuit operating parameters must be pushed to their limits, the result being a potentially decreased yield. This decreased yield can be improved with innovative fabrication techniques, but a large number of marginal devices will still be classified as defective. The marginal operating parameters can be the result of very small defects in such circuits as the control circuitry for the MOS RAM. Without some form of adjustment, the marginal device will be discarded.

Heretofore, a number of techniques have been developed in order to provide a more "defect tolerant" device. One such technique utilizes redundant circuits on the chip to replace defective circuits. These redundant circuits can be placed in operation to permanently override the defective circuit portion. Redundant circuits are utilized, for example, to replace defective memory cells. However, the degree of defect tolerance provided by redundant circuitry is a function of the percentage of circuitry on a particular chip that is made redundant which, as a practical consideration, must be minimized. The redundant circuits essentially replace sections of the circuitry rather than modify the actual operating parameters of the circuitry itself. In marginal devices, the defect is usually the result of operating parameters that deviate too far from a predetermined value. Such parameters as access time, signal sensitivity and power dissapation may be the result of a weak device or a timing delay that is too short, consequently causing the device to operate marginally for a particular operation. The use of redundant circuitry to correct marginal operating parameters may not be cost effective in that the defect of the operating device may also be reflected in the redundant device.

In view of the above disadvantages, there exists a need for a method to adjust the operating parameters on a chip to compensate for fabrication variations to both increase yield and to provide increased versatility at the manufacturing level.

SUMMARY OF THE INVENTION

The present invention disclosed and claimed herein comprises a circuit with adjustable operating parameters. The circuit includes a functional circuit block having a plurality of discrete circuits contained therein. The discrete circuits are interfaced in a predetermined manner to perform a desired function according to predefined operating parameters of the functional circuit block. A control circuit is provided for generating control signals that control the operating parameters of the functional circuit block to effect the performance of the desired function with the discrete circuits. The control signals are varied to effect a permanent change in the operating parameters of the functional circuit block in discrete steps.

In another embodiment of the present invention, the control signals are varied by generating an activation signal in response to the opening of a fuse. A plurality of fuses are provided and associated with a plurality of activation signals. Each activation signal is associated with a discrete variation in the operating parameters such that a select deviation of the operating parameters from a predefined level can be effected.

BRIEF DESCRIPTION OF THE DRAWINGS

For a more complete understanding of the present invention and the advantages thereof, reference is now made to the following description taken in conjunction with the accompanying Drawings in which:

FIG. 5 illustrates a schematic block diagram of the clock generator for generating the fast and slow clocks for controlling the sense amplifier;

FIG. 6 illustrates a schematic diagram of a typical delay stage in the clock generator of FIG. 5;

FIG. 7 illustrates a schematic diagram of the delay portion of the stage of FIG. 6; and FIG. 8 illustrates a schematic diagram of the sensitivity portion of the sense amps of FIG. 2.

DETAILED DESCRIPTION OF THE INVENTION

Figure 1:
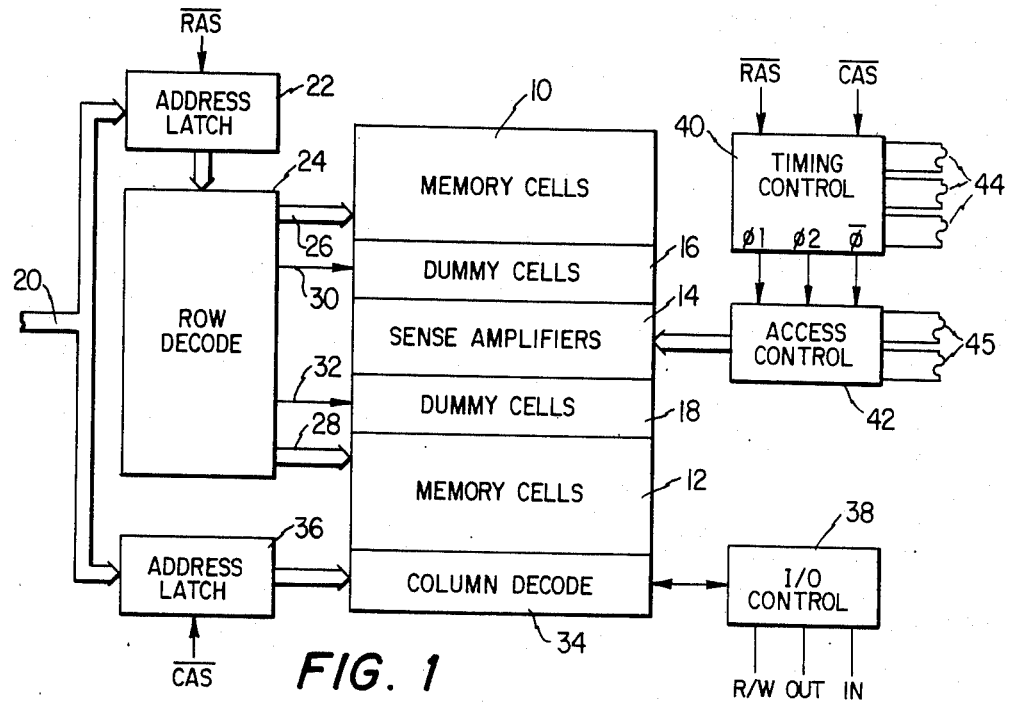
FIG. 1 illustrates a schematic block diagram of a MOS memory device utilizing the fuse links in accordance with the present invention.

Referring now to FIG. 1, there is illustrated a schematic block diagram of a Dynamic Random Access Memory (DRAM) MOS device that has variable operating parameters in accordance with the present invention. The Random Access Memory device is of the type described in U.S. Pat. Nos. 4,081,701 issued to White et al. on Mar. 28, 1978 and 4,050,061, issued to Kitagawa, both assigned to Texas Instruments Incorporated. The DRAM is comprised of an array of memory cells 10 and an array of memory cells 12 disposed on opposite sides of a row of sense amplifiers 14. A row of dummy cells 16 and a row of dummy cells 18 are disposed on either side of the sense amplifiers 14 and adjacent thereto. The memory cell arrays 10 and 12 are each comprised of individual memory cell elements arranged in rows and columns. One sense amplifier is associated with each column of both of the arrays 10 and 12 such that an individual memory cell can be selected from a given column and the output thereof sensed by the associated one of the sense amplifiers.

The row of memory elements that is selected for interface with the sense amplifiers 14 is determined by an address received on the input of an address bus 20. The address is latched into an address latch 22 by a row address strobe (RAS) and the output thereof input to a row decoder 24. The row decoder activates one of the rows in either of the arrays 10 or 12 by outputting a signal on row control lines 26 associated with the memory cell array 10 or row control lines 28 associated with the memory cell array 12. In addition, the dummy cells 16 or 18, opposite the sense amplifier row 14 from the activated one of the memory cell arrays 10 or 12, are also activated through dummy cell control lines 30 or 32.

When a row is selected, all of the memory cells in that rows are interfaced with the associated one of the sense amplifiers in the row of sense amplifiers 14. The data is transferred and stored in the sense amplifiers and then the sense amplifiers 14 accessed by a column decode circuit 34. The column decode circuit 34 is addressed by a column address placed on the address bus 20. This address is latched in an address latch 36 under control of a column address strobe (CAS) and then input to the column decode circuit 34. The column address determines which of the sense amps is selected to output data therefrom. This data is output to an input/output (I/O) control 38 for interface with peripheral circuits.

A timing control circuit 40 receives the row and column address strobes on the input thereof to initiate the generation of various delay clocks of which $\phi 1$, $\phi 2$ and $\phi$ are illustrated. The output of the timing control circuit 40 is input to an access control circuit 42 which controls the operation of accessing data stored in the memory cells of the arrays 10 and 12. As will be described hereinbelow, variations in the relationships in these various delay clocks significantly affect the access parameters of a DRAM. In order to adjust these delays, fuse links 44 are interfaced with the timing control circuit 40 and function to vary the delays in discrete steps when the fuse is broken. In addition, fuse links 45 are interfaced with access control 42 to vary the parameters of the sense amps, as will be described hereinbelow.

In operation, the device is tested with fuses 44 and 45 intact. The parameters are then recorded and the device classified as to whether it is acceptable, marginal or defective. If it is marginal, a decision is made as to whether the operating parameters can be brought within the acceptable range by opening one of the fuses 44 or 45. If so, the fuse is selected and opened and the device submitted to testing. Conventionally, the fuses are located in a centralized region and identified by sequence or some form of patterned label. An appropriate device such as a laser is utilized to open the fuse after selection thereof. Once opened, the change is permanent and the device is either classified as acceptable or it is discarded.

Alternately, a device may be acceptable for one application but not for another. For example, the access times for an MOS memory may be classified in two groups, fast and slow. If a particular "production run" results in a large number of slow devices and few fast devices, it may be desirable to adjust the parameters of the slow devices to produce more fast devices rather than fabricate more devices.

Figure 2:
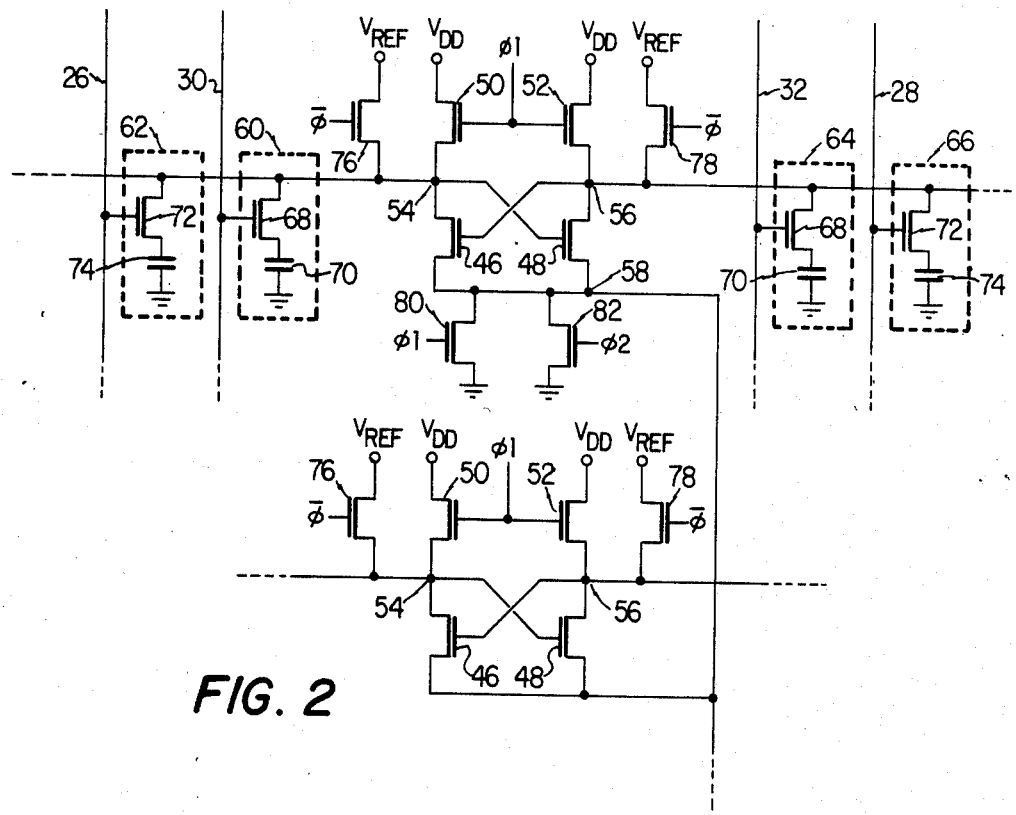
FIG. 2 illustrates a schematic block diagram of the sense amplifiers of the MOS memory of FIG. 1.

Referring now to FIG. 2, there is illustrated a schematic diagram of two adjacent ones of the sense amplifiers in the sense amplifier row 14. Each of the sense amplifiers consists of a flip-flop or bistable circuit having two cross-coupled driver transistors 46 and 48 along with associated load transistors 50 and 52. A node 54 represents a column line in the array 10 and a node 56 represents a column line in the array 12. The node 54 is connected to the drain of the transistor 46 and a gate of the transistor 48, with the node 56 being connected to the drain of the transistor 48 and the gate of the transistor 46 to form a cross-coupled arrangement. The sources of transistors 46 and 48 are connected to a common node 58. The load transistors 50 and 52 have the sources thereof connected to the nodes 54 and 56, respectively, and the gates thereof connected to the signal $\phi 1$. The sources thereof are connected to $V_{DD}$.

The node 54 has a dummy cell 60 connected thereto and controlled by the dummy cell control line 30 and a memory cell 62 controlled by one of the control lines 26, the memory cell 62 representative of all of the memory cells attached to a select column line in the array 10. In a similar manner, the node 56 has a dummy cell 64 connected thereto and controlled by the dummy cell control line 32 and a memory cell 66 connected thereto and controlled by the memory cell control line 28, the memory cell 66 representative of all of the memory cells in the array 12 connected to the node 56.

The dummy cells 60 and 64 are each comprised of a transistor 68 and a capacitor 70. The gates of transistor 68 are activated by the dummy cell control lines 30 or 32, respectively. Each of the memory cells 62 and 66 is comprised of a transistor 72 and a capacitor 74. The gates of the transistor 72 are activated by the row control lines 26 and 28, respectively. Each of these cells is further described in U.S. Pat. No. 3,909,631, issued to Kitagawa on Sept. 30, 1975 and assigned to Texas Instruments Incorporated. In operation, one of the memory cells connected to either the node 54 or 56 is selected, and the dummy cell connected to the opposite node is activated by the appropriate one of the dummy cell control lines 30 or 32.

The node 54 is connected to a reference voltage $V_{REF}$ through a transistor 76 and the node 56 is also connected to $V_{REF}$ through a transistor 78. The transistors 76 and 78 have the gates thereof connected to the clock signal $\phi$. The transistors 76 and 78 function to charge the nodes 54 and 56 equally to the voltage levels selected to be approximately ($V_{DD}$-2$V_T$).

The source of each of the transistors 46 and 48 in each of the sense amplifiers, as described above, is connected to a common node 58. This node 58 is connected to ground through a transistor 80 which has the gate thereof driven by the timing signal $\phi1$ and also through a transistor 82 which has the gate thereof driven by the timing signal $\phi2$. The transistors 80 and 82 are operable to determine the amount of current drawn from the node 58 to ground. The sensitivity of the sense amplifiers is a function of the current drawn through the transistors 46 and 48, as described in detail in U.S. Pat. No. 4,050,061.

As will be described in more detail hereinbelow, when the clock $\phi1$ goes positive, a sense operation is initiated and the flip-flop will tend to go toward a stable condition where either the transistor 46 is conductive and transistor 48 is cut off, or vice versa. The direction of switching depends upon the voltage difference between nodes 54 and 56 which in turn depends upon whether a logic "1" or a logic "0" was stored in the selected memory cells 62 or 66. Since one of the nodes 54 or 56 will be at a slightly higher voltage than the other, one of the transistors 46 or 48 will have a slightly higher voltage on its gate than the other, and thus when $\phi1$ goes positive, one transistor will tend to conduct slightly more current than the other. Therefore, the transistors 80 and 82 control the sensitivity of the sense amplifiers in the row of sense amplifiers 14 in FIG. 1. The transistors 80 and 82 constitute a portion of the access control 42 in addition to the transistors 76 and 78 which equalize the voltage on the nodes 54 and 56.

Figure 3:
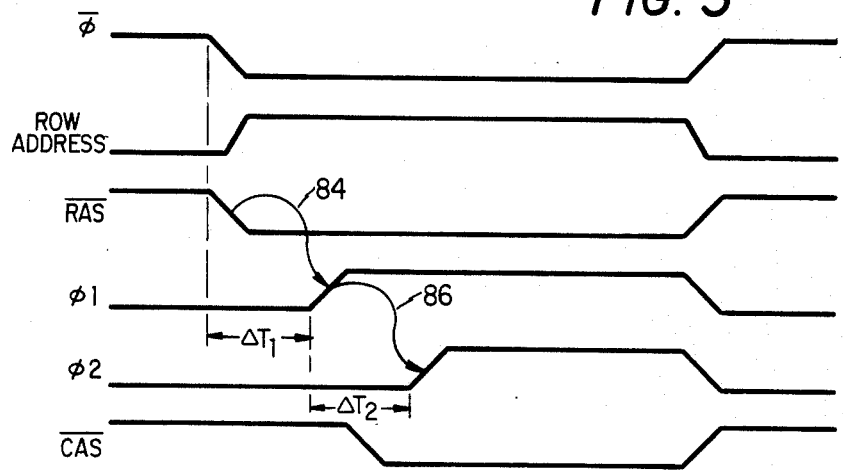
FIG. 3 illustrates timing diagrams for accessing data in the MOS memory device.

Referring now to FIG. 3, there is illustrated a timing diagram for the data accessing operation in one of the memory cells and outputting the sense voltage from the sense amplifier. When $\phi$ is high, the reference voltage is connected to the nodes 54 and 56 to equalize the voltage thereat to $V_{REF}$. When $\phi$ goes low, the row address strobe also goes from a high to a low state, thereby initiating a number of other timing signals such as $\phi1$ and $\phi2$. The timing signal $\phi1$ is shown with the leading edge thereof delayed from the trailing edge of RAS by $\Delta T_1$ and the leading edge of $\phi2$ is delayed from leading edge of $\phi1$ by $\Delta T_2$. A curved arrow 84 indicates the transition in the RAS signal that causes the leading edge transition in $\phi1$. A similar curved arrow 86 represents the cause and effect relationship between the transition in $\phi1$ and the transition in $\phi2$. As will be described hereinbelow, the operating parameters of the data accessing operation are in part affected by the timing delay $\Delta T_2$.

Figure 4:
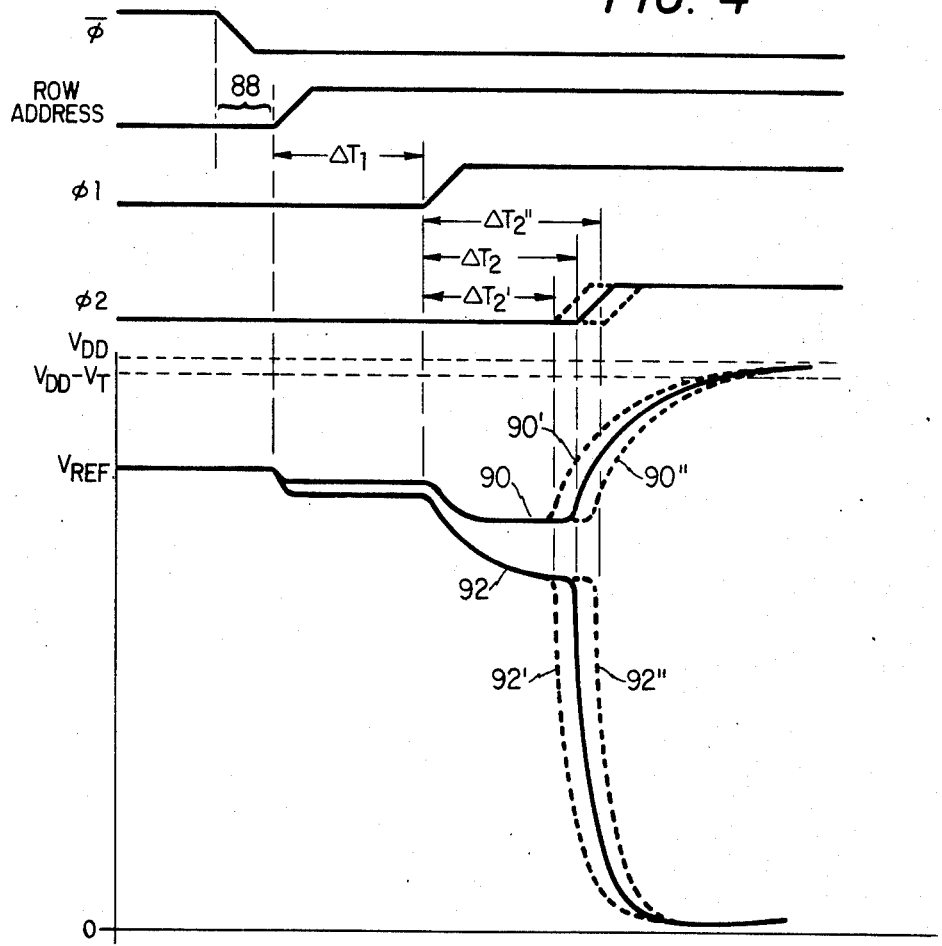
FIG. 4 illustrates a detailed timing diagram of the sense amplifier during data access.

Referring now to FIG. 4, there are illustrated timing diagrams for the clock waveforms $\phi1$ and $\phi2$ and also the voltage response of the two nodes 54 and 56. When $\phi$ is high, as described above, the reference voltage $V_{REF}$ is connected to the nodes 54 and 56. After $\phi$ goes low, the voltage on the nodes 54 and 56 is allowed to equalize for a period of time 88 before the row address signal goes high. When the selected one of the row control lines 26 or 28 goes high, the voltages on the nodes 54 and 56 separate very slightly, perhaps 50 to 100 mV due to one of the storage capacitors 74 in the memory cell 62 or 66 being connected to one side and a dummy cell capacitor 70 (smaller than capacitor 74) being connected to the other. After the delay $\Delta T_1$, $\phi1$ goes high and one of the nodes 54 or 56 begins to discharge toward a logic "0" level during $\Delta T_2$ while the other discharges only slightly, not over about one volt. This is represented by a curve 90 and a curve 92 with the curve 90 being positive with respect to the curve 92. If a logic "1" was stored in the selected cell, the transistor 46 or 48 opposite the select cell conducts more than the one opposite the dummy cell during the time $\Delta T_2$. If a logic "0" is stored, the reverse situation occurs.

At the beginning of the interval 88 when $\phi$ goes to zero, the nodes 54 and 56 are isolated from $V_{REF}$ and they begin to separate at the beginning of $\Delta T_1$ when the row address line goes high, since a dummy cell is connected on one side of the nodes 54 and 58 and a memory cell is connected to the other node. This causes a voltage differential to be established by charge difference between dummy cell capacitance 70 and the memory cell capacitance 74. As $\phi1$ goes high at the end of $\Delta T_1$, a current path is established between node 58 and ground through transistor 80. During $\Delta T_2$, the node 54 or 56 which is to be at the logic "1" level does not discharge very far below the voltage ($V_{REF}$-$V_T$), and soon begins to charge back up towards the logic "1" level through load transistors 50 or 52. The logic "1" level is approximately ($V_{DD}$-$V_T$).

At the end of the interval $\Delta T_2$ when $\phi2$ goes high, additional current is allowed to flow from the node 58 to ground through the transistor 82 to amplify the voltage difference between the two curves 90 and 92. Curve 92 then rapidly discharges toward a logic "0" level and the curve 90 is charged toward the logic "1" level.

The voltage difference between the signal curves 90 and 92 is a function of the timing intervals $\Delta T_1$ and $\Delta T_2$ and also the charge stored on the memory cell capacitor 74 and the relative size of the memory cell capacitor 74 and the dummy cell capacitor 70. As this signal decreases, the difference between a stored logic "1" and a stored logic "0" also decreases, thus decreasing the voltage difference between the curves 90 and 92 during the time period $\Delta T_2$. The voltage difference can be adjusted by increasing $\Delta T_2$ time, but this would also affect the access time of the stored logic state.

The access time is directly affected by the internal delays in the timing control 40 which generate the signals $\phi1$ and $\phi2$ separated by delay $\Delta T_2$. If this delay is too long, access time can be excessive, thus causing a device to fail. However, if the delay becomes too short, the separation of the voltage on the nodes 54 and 56 may be insufficient to detect small signal levels, thus also causing the device to fail. As will be described hereinbelow, the fuses 44 connected to the timing control 40 allow for adjustment of the delay. Since all of the delays in the timing control 40 are dependent to some extent upon each other, one fuse can control the operation of multiple timing delays.

Referring now to FIG. 5, there is illustrated a schematic block diagram of the internal circuitry for generating the signal $\phi1$ and $\phi2$ from the strobe RAS. RAS is input to a first delay stage 94 to provide a predetermined amount of delay and then successively to two cascaded stages 96 and 98. The output of the delay stage 98 is the $\phi1$ signal, which is also input to a fourth delay stage 100. The output of the delay stage 100 is $\phi2$.

Therefore, the delay stages 94, 96 and 98 provide the delay for $\Delta T_1$ and the delay stage 100 provides the delay for $\Delta T_2$.

Referring now to FIG. 6, there is illustrated a schematic diagram of the delay stage 100 of FIG. 5. This delay stage is similar to that disclosed in U.S. Pat. No. 4,239,991, issued to Hong, et al. on Dec. 16, 1980 and assigned to Texas Instruments Incorporated. The delay stage 100 has the signal $\phi 1$ applied on input node 102 and the output $\phi 2$ taken off of the output node 104. A transistor 106 is connected between $V_{DD}$ and a node 108 with the gate thereof connected to the input node 102. A transistor 110 is connected between the node 108 and ground and has the gate thereof connected to $\phi$. A transistor 112 is connected between a node 114 and ground and a transistor 116 is connected between a node 118 and the node 114. The gates of the transistors 112 and 116 are connected to the node 108. A capacitor 120 is connected between the nodes 108 and 114. A transistor 122 is connected between $V_{DD}$ and the node 114 and a transistor 124 is connected between $V_{DD}$ and the node 118, the gates of transistors 122 and 124 being connected to $\phi$.

When $\phi$ is high, node 108 is maintained at ground potential through transistor 110 and nodes 114 and 118 are maintained at ($V_{DD}$-$V_T$). When $\phi$ makes a transition to a low potential and $\phi 1$ makes a transition to a high potential, transistor 106 is turned on and current is supplied by $V_{DD}$ to node 108 to charge one side of the capacitor 120. When the voltage on the node 108 equals or exceeds $V_T$ of the transistor 112, the transistor 112 turns on and lowers the voltage on the node 114. This in turn lowers the voltage on node 108 to maintain the transistor 116 in an OFF condition until sufficient current can be supplied through the transistor 106 to increase the node 108 above the voltage on the node 114 by $V_T$ of the transistor 116, at which time transistor 116 turns on. This causes the node 118 to make a transition from a high to a low level. The transition of the node 118 is delayed from the transition of $\phi 1$ by the amount of time required to charge capacitor 120 to turn on transistors 112 and 116. This is determined by the source to drain resistance of transistor 106 and the lump capacitance of capacitors 120 and the gate capacitance of transistors 112 and 116. A node 125 is connected to a node 102 through a transistor 126. The gate of the transistor is maintained at a level ($V_{DD}$-$V_T$) through an isolation transistor 128 which is connected between the gate of the transistor 126 and the node 118. A transistor 130 is connected between a node 132 and ground and a transistor 134 connected between the output node 104 and ground, the gates of the transistors 130 and 134 being connected to the node 118. A transistor 136 is connected between $V_{DD}$ and the node 132 and a transistor 138 is connected between $V_{DD}$ and the output node 104, the gates of transistors 136 and 138 being connected to the node 125. A capacitor 120 is connected between the nodes 125 and 132.

Node 118 initially is precharged to a high voltage level, thereby maintaining transistor 126 and transistors 130 and 134 on. When $\phi 1$ is low, the transistors 136 and 138 are maintained off. When $\phi 1$ makes the transition to a low voltage after a duration of time determined by the delay capacitor 120 and the source to drain resistance of the transistor 106, the transistors 130 and 134 are turned off and the node 132 rises quickly and boosts the voltage on node 125 through the capacitor 140. This raises the gate voltage of the transistor 138 above $V_{DD}$, thereby delivering the full voltage level of $V_{DD}$ to the output node 104.

With the circuit of FIG. 6, $\phi 2$ is delayed from $\phi 1$ by a delay that is determined by the capacitor 120 lumped with the gate capacitances of the transistors 112 and 116 and other capacitances associated therewith. If the capacitance causing the delay deviates from the design value by more than a predetermined margin, the delay $\Delta T_2$ will vary, thus varying the access time of the device. Since the delay $\Delta T_2$ controls all of the sense amps in the MOS memory device, the access time of the entire device can be affected by a single component in the timing control 40.

With the use of the fuses 44 on the timing control 40 of FIG. 1, the timing parameters can be changed such that one of the internal delay circuits can be selected and have the delay thereof altered. In this manner, a number of timing parameters can be changed with the breakage of one fuse. For example, both $\phi 1$ and $\phi 2$ are delayed from the RAS signal such that the delay of any of the circuits 94–98 of FIG. 5 will alter the delay of both signals $\phi 1$ and $\phi 2$. Alternately, by changing the delay of the delay cicuit 100, only the relationship of $\phi 2$ to $\phi 1$ is altered which, as described above, can affect the access time of each of the sense amps. This is an important aspect of the invention in that a system alteration can be provided by breaking one fuse in a centralized portion of the control circuitry comprised of the timing generator 40 and the access control 42. Due to the large number of circuits utilized to implement MOS devices, it is not practical to alter the parameters of every circuit or device but, rather, the fuse is utilized to alter only the parameters of centralized control circuitry.

Referring now to FIG. 7, there is illustrated a schematic diagram of a section of the delay stage 100 of FIG. 6 illustrating the transistors 112 and 116 showing one embodiment of the fuse activated variable delay. The capacitor 120 has one end thereof connected to node 108 and the other end thereof connected to the node 114 through a fuse 140. The fuse 140 bridges a capacitor 142 and, while the fuse 140 is intact, the capacitor 142 is not part of the delay function. The capacitor 120 is bridged by a series connected capacitor 144 and fuse 146. When the fuse 146 is intact, the capacitor 120 and the capacitor 144 are in parallel, thereby increasing the overall capacitance. If the fuse 146 is broken, the capacitance is reduced. In a similar manner, the fuse 140 bypasses the capacitor 142, thereby taking it out of the circuit. When the fuse 140 is broken, the capacitor 142 is in series with the capacitor 120, thereby decreasing the capacitance. However, it should be understood that only one of the capacitor circuits utilizing the capacitors 142 and 144 is necessary since the result is the same.

When either of the fuses 140 or 146 is broken, the capacitance of the circuit decreases, thus causing the delay $\Delta T_2$ to decrease between $\phi 1$ and $\phi 2$. To increase the capacitance or the charge time on the node 108, a capacitor 148 is connected between the node 108 and ground through a series transistor 150. The transistor 150 has its gate connected to a node 152 with a fuse 154 pulling the node 152 to ground. A transistor 156 has the gate and source thereof connected to $V_{DD}$ and the drain thereof connected to node 152 to supply current thereto. When the fuse 154 is opened, the gate of the transistor 150 goes high, thus connecting the capacitor 148 to the node 108. This effectively increases the capacitance on the node 108, thus increasing the delay time.

Referring further to FIG. 4, the delay $\Delta T_2$ between $\phi 1$ and $\phi 2$ is illustrated with two limits $\Delta T_2'$ and $\Delta T_2''$ wherein $\Delta T_2'$ represents a decrease in the delay and a corresponding increase in the access time and $\Delta T_2''$ represents an increase in the delay and a corresponding decrease in access time. By varying the delay $\Delta T_2$, the time at which the sensitivity of the sense amp is increased with the control transistor 82 is increased or decreased. The decreased delay $\Delta T_2$ is represented by the curves 90' and 92' and the increased delay $\Delta T_2''$ is represented by the curves 90" and 92". By varying the delay, the amount of separation between the two curves varies at the time the sensitivity is increased.

Referring now to FIG. 8, there is illustrated a schematic diagram of circuitry connected in parallel with the transistors 80 and 82 for controlling current flow through the node 58 to ground to control the sensitivity of all of the sense amps in the DRAM. A transistor 158 has one lead thereof connected to ground and the other lead thereof connected to one lead of a transistor 162. The other lead of the transistor 162 is connected to the node 58 such that the transistors 158 and 162 form a series pair in parallel with the transistor 82. The gate of transistor 162 is connected to the signal $\phi 2$. The gate of the transistor 158 is connected to ground through a fuse 160. A transistor 163 has one lead and the gate thereof connected to $V_{DD}$ and the other lead thereof connected to the gate of the transistor 158 to supply current thereto. With the fuse 160 intact, the transistor 158 does not conduct and, therefore, no current is flowing through the transistor 162. However, when the fuse 160 is opened, the transistor 158 conducts, thereby drawing current through transistor 162. The device ratio for the transistor 162 is selected to draw a selected current from the node 58 with the transistor 158 having a device ratio to provide a very low resistance thus not affecting the current flow.

In a similar manner, transistors 164 and 166 are connected in series between the node 58 and ground. The gate of the transistor 164 is connected to ground through a fuse 168 and also to $V_{DD}$ through a transistor 169. Transistor 169 has the gate thereof connected to $V_{DD}$ similar to the transistor 163. The transistor 166 only conducts when the fuse 168 is open.

As described in U.S. Pat. No. 4,050,061, the sensitivity of the amplifier is defined by the device ratio W/L of the transistors connected between the node 58 and ground, which affects the voltage on the node 58. By placing transistors in parallel, the sensitivity can be altered. This is accomplished by opening either the fuse 160 or 168.

The fuses described above can be any conventional type of fuse such as a polysilicon link or other similar material that has a thickness less than that of a conventional laser beam. It is then only necessary to direct the laser beam onto the fuse link for a predetermined amount of time in order to open circuit the fuse link. In this manner, an operating parameter can be altered on a given circuit.

In summary, there has been provided an MOS device comprised of a functional circuit which is controlled by a central control circuit, wherein the parameters of the functional circuit are determined by the control circuitry. In one example of this functional circuit, an MOS memory is disclosed which has the access time determined by internal timing signals and a timing generator and the sensitivity of the sense amps determined by an access control circuit. Fuse links are provided on the timing control circuit to cause the internal timing delays to either increase or decrease depending upon the desired result. These decreases are discrete variations which provide an increased degree of freedom in adjusting the access parameters of the sense amps. In addition, circuitry is disclosed which directly affects the sensitivity of the sense amp during the sensing operation such that the gain thereof can be varied in either direction in discrete steps. This allows another degree of freedom to control the access operation for the MOS memory. This is important in situations where the operating parameters are marginal for a given specification. For example, if the access time of a particular device is too high for a given application, it is only necessary to open one fuse link on the chip to vary the access time of a given device. In this manner, marginal failures can be corrected. In addition, the operating parameters of one classification of devices can be altered such that they meet specification of another class of devices. This increases the versatility of a given device in addition to providing significant improvements in yield.

Although the preferred embodiment has been described in detail, it should be understood that various changes, substitutions and alterations can be made therein without departing from the spirit and scope of the invention as defined by the appended claims.

What is claimed is:

1. A circuit with permanently adjustable operating parameters, comprising:
    a functional circuit block having a plurality of discrete circuits contained therein, said discrete circuits interfaced in a predetermined manner to perform a desired function according to operating parameters associated with said functional circuit block, said operating parameters including parameters responsive to the timing of clock control signals;
    control means for generating a plurality of clock control signals of varied timing for controlling the timing of operation of said discrete circuits to effect the performance of said desired function with said plurality of discrete circuits in said functional circuit block; and
    means for permanently altering the timing of a selected one of said clock control signals within said control means to effect a change in the time of operation of at least one of said discrete circuits of said functional circuit block.

2. The circuit of claim 1 wherein said means for permanently altering said clock control signals is operable to selectively change the clock of operation in discrete steps.

3. The circuit of claim 1 wherein said clock control signals comprise a plurality of timing signals having preset delays therebetween and said desired function in said functional circuit block is dependant upon said preset delays wherein said altering means comprises means for effecting a permanent change in a selected one of said preset delays.

4. The circuit of claim 1 wherein said clock control signals comprise a plurality of gain determining signals, and wherein said operating parameters of said functional circuit block are dependent upon said gain determining signals, and wherein said altering means comprises means for effecting a permanent change in a select one of said gain determining signals.

5. The circuit of claim 1 wherein each of said clock control signals is generated at a predetermined value and said altering means causes said selected one of said clock control signals to deviate above or below said predetermined value.

6. The circuit of claim 1 wherein said altering means alters the select one of said clock control signals in a plurality of discrete steps with each of said discrete steps independently selectable.

7. The circuit of claim 1 wherein said functional circuit block comprises a dynamic random access MOS memory and the desired function comprises the access time of data in said random access memory, said clock control signals controlling the access time of said random access memory.

8. The apparatus of claim 1 wherein said desired function of said functional circuit block is dependent upon a sequential series of timing signals, each of said timing signals being delayed from a corresponding selected time by a predetermined time delay; wherein said control means comprises:
   a timing generator for receiving an external signal and processing said external signal through a plurality of delay stages such that the output of each of said delay stages is accessible to provide a predetermined number of delays to control said functional circuit block; and
   said altering means comprises means for permanently altering the delay in select ones of said delay stages.

9. The circuit of claim 1 wherein said altering means comprises:
   circuit means for selectively varying each of said clock control signals by a predetermined amount in response to an activation signal associated with each of said clock control signals; and
   means for permanently applying said activation signal associated with the select one of said clock control signals.

10. The apparatus of claim 9 wherein said activating means comprises a fuse link, opening of said fuse link providing said activation signal and effecting a permanent change in the selected one of said clock control signals.

11. A circuit with adjustable operating parameters, comprising:
   a functional circuit block having a plurality of discrete circuits contained therein, said discrete circuits interfaced in a predetermined manner to perform a desired function in response to clock control signals input thereto;
   said clock control signals operating with a defined set of operating parameters for said functional circuit block;
   control means for generating said clock control signals to control said functional circuit block to operate within said operating parameters at a predefined operating level;
   deviation means for causing a selected one of said clock control signals to change in selectable discrete steps in response to activation signals associated with each discrete step and each of said control signals, the altered one of said clock control signals causing said operating parameters to deviate from said predefined operating level in corresponding discrete steps;
   a plurality of fuse links, each fuse link defining a current path, each of said fuse links being associated with a different; breaking of each of said fuse links permanently removing the associated one of said current paths; and
   means for generating said activation signals in response to the breaking of the associated one of said fuse links and the corresponding removal of the associated current paths such that a permanent change in the operating parameters of said functional circuit block is effected.

12. The circuit of claim 11 wherein said clock control means generates said control signals in response to an external signal.

13. The circuit of claim 11 wherein said operating parameters are defined in terms of clock control signals separated by predetermined delays and said control means generates said clock control signals wherein said deviation means comprises means for selectively varying each of said delays in discrete steps.

14. The circuit of claim 11 wherein said operating parameters are defined in terms of a plurality of gain signals for controlling circuit gains, said clock control signals consisting of said gain signals wherein said deviation means comprises means for selectively altering said gain signals in discrete steps.

15. The circuit of claim 11 wherein said functional circuit block, said control means, said deviation means, said fuse links and said activation means are integrated into a single circuit with said fuse links accessible for opening from an external source.

16. The circuit of claim 15 wherein said external source is a laser and said fuse links comprise a strip of metal.

17. A method of adjusting circuit operating parameters, comprising:
   arranging a plurality of discrete circuits in a functional circuit block, the discrete circuits interfaced in a predetermined manner to perform a desired function according to predetermined operating parameters for the functional circuit block;
   generating clock control signals for controlling the operating parameters of the functional circuit block to effect the performance of the desired function with the plurality of discrete circuits; and
   altering at least a selected one of the control signals to permanently effect a change in at least one of the operating parameters of the functional circuit block.

18. The method of claim 1 wherein said selected one of said clock control signals is varied in a plurality of discrete steps, each discrete step selectable.

19. The method of claim 17 wherein the step of altering the control signals comprises:
   forming a plurality of fuse links for defining a plurality of current paths, a different one of said current paths being associated with each one of said fuse links, whereby opening of each one of the fuse links removes the associated one of the current paths;
   generating an activation signal in response to the opening of one of the fuse links, a separate activation signal being associated with each of the fuse links; and
   varying the select one of the control signals as a function of the generated one of the activation signals, each of the activation signals corresponding to a predetermined value for the operating parameters such that the operating parameters can be varied in discrete steps.

* * * * *